United States Patent [19]

Ohta et al.

[11] Patent Number: 4,838,710
[45] Date of Patent: Jun. 13, 1989

[54] STATIC PRESSURE GAS BEARING ASSEMBLY

[75] Inventors: Jiro Ohta, Tokyo; Sadamu Tozawa, Ushiku; Koichi Matsushita, Chiba; Yutaka Maruyama, Kawasaki, all of Japan

[73] Assignee: Canon Kabushiki Kaisha, Tokyo, Japan

[21] Appl. No.: 102,358

[22] Filed: Sep. 29, 1987

[30] Foreign Application Priority Data

Sep. 14, 1986 [JP] Japan ............................ 61-228578
Sep. 30, 1986 [JP] Japan ............................ 61-230038
Sep. 30, 1986 [JP] Japan ............................ 61-230037

[51] Int. Cl.$^4$ ........................ F16C 32/06; F16C 33/02
[52] U.S. Cl. ................................ 384/100; 384/107; 384/279; 384/625; 384/902
[58] Field of Search ............... 384/12, 100, 107–110, 384/114, 279, 625, 902, 912, 913

[56] References Cited

U.S. PATENT DOCUMENTS

| | | | |
|---|---|---|---|
| 2,645,534 | 7/1953 | Becker | 384/107 |
| 2,855,249 | 10/1958 | Gérard | 384/279 |
| 3,349,462 | 10/1967 | Mott | 384/114 X |
| 3,352,612 | 11/1967 | Eudier | 384/279 |
| 3,645,590 | 2/1972 | Bird et al. | 384/113 |
| 4,013,326 | 3/1977 | King | 384/113 |
| 4,522,453 | 6/1985 | Lammer et al. | 384/907 X |

FOREIGN PATENT DOCUMENTS

| | | |
|---|---|---|
| 2712126 | 9/1978 | Fed. Rep. of Germany . |
| 3110712 | 9/1982 | Fed. Rep. of Germany . |
| 3230232 | 2/1984 | Fed. Rep. of Germany . |
| 0018879 | 7/1975 | Japan . |
| 0039633 | 12/1975 | Japan . |
| 653581 | 1/1986 | Switzerland . |

*Primary Examiner*—Thomas R. Hannon
*Attorney, Agent, or Firm*—Fitzpatrick, Cella, Harper & Scinto

[57] ABSTRACT

A static pressure gas bearing assemby having a gaseous fluid discharging bearing member for supporting a shaft by the discharged gaseous fluid is disclosed. The bearing member is made of porous graphite. For the manufacture, carbon particles approximately 80% of which have particle diameters not greater than approx. 40 microns, more particularly, particle diameters ranging from 1–20 microns are used. The carbon particles are subjected to molding, calcination and graphitization, whereby a porous graphite member having pores distributed substantially uniformly is obtained. In another aspect of the invention, the bearing member is made of a porous graphite material having a specific degree of swelling. Also, in another aspect, the surface of the shaft to be supported by the bearing member is coated with titanium nitride by ion plating treatment. In this manner, a high-precision and high-prerformance bearing assembly can be provided with reduced manufacturing costs.

9 Claims, 6 Drawing Sheets

STATIC PRESSURE GAS BEARING ASSEMBLY

FIELD OF THE INVENTION AND RELATED ART

This invention relates to improvements in a static pressure gas bearing assembly wherein a bearing member, called a bearing pad, made of a porous material is disposed at a bearing area opposed to a member (such as a rotatable shaft) to be supported and wherein a pressurized gaseous fluid such as pressurized air is discharged from pores of the bearing pad into a minute clearance between the bearing pad and the member to be supported such that a gaseous film is formed in this clearance to support the member to be supported.

In this type of bearing assembly and in order to obtain superior bearing performance such as bearing rigidity, load capacity, rotating precision or otherwise, it is necessary that the gaseous fluid supplied to the porous bearing pad under a predetermined pressure is discharged uniformly from the bearing pad with the result that, over the whole surface of the bearing pad opposed to the member to be supported, the flow rate or quantity discharged per unit area (i.e. the flow rate of the gaseous fluid, per unit area, passed through the bearing pad) is uniform.

As for the material of the porous member usable as the bearing pad in the gas bearing assembly, usually, porous graphite is used. Such porous graphite member can be produced by: grinding calcined coke; kneading the ground coke with a binder such as pitch added thereto, while heating them; forming (by pressure molding) the kneaded coke powder into an article; heating the molded article to a temperature of about 1000°–1400° C. for calcination; impregnating the calcined article with a binder pitch under reduced pressure so as to reduce interstices in the calcined article; heating again the article for calcination; and, after repeating the above-described impregnation and calcination, heating the article to a temperature of about 2000°–3000° C. for graphitization.

However, such conventional porous graphite material shows undesirable characteristics. For example, the density is low. Also, micro-cracking occurs easily. Further, the particle diameter of the coke powder is not uniform. Because of these features, when such porous graphite material is used as a bearing pad in a static pressure gas bearing assembly, the quantity of gaseous fluid discharged from the bearing surface (i.e. the rate of gas flow through the bearing pad) is too large or too small as compared with a designed value. Further, the quantity distribution is not uniform. In consideration of this, the manufacture of conventional static pressure gas bearing assemblies using the porous graphite material as the bearing pad necessarily includes a flow adjustment operation which is to be executed after the finishing of the bearing surface in order that a desired quantity of gaseous fluid is discharged with uniform distribution.

More specifically, after completion of the finishing operation such as cutting, grinding and otherwise, the bearing surface of the porous graphite bearing pad is coated with or impregnated with resin or otherwise. Thereafter, while measuring the flow rate of gaseous fluid passed through the pad, the resin material or the like is removed gradually by use of a solvent until a uniform distribution of the discharging quantity of gaseous fluid is obtained. However, such flow adjusting operation requires expert work by a skilled operator. As a result, it is difficult to consistently maintain good quality. Also, many processes are necessary. Due to these features, the necessity of the flow adjusting operation is a bar to the mass-production of the static pressure gas bearing assemblies.

Furthermore, in the conventional porous graphite material, there occurs swelling which is a phenomenon that the size of the graphite member changes with the humidity. It is considered that such swelling results from the moisture absorption by the pitch (used as the binder), the micro-cracks and the pores in the porous member. If the swelling is enormous, it is necessary to strictly control the humidity of the gas ambience of the bearing assembly to maintain the operability of the bearing assembly.

SUMMARY OF THE INVENTION

It is accordingly a primary object of the present invention to provide a static pressure gas bearing assembly which assures uniform distribution, over the whole bearing surface, of the flow rate of gaseous fluid passed through a porous bearing member without the necessity of flow adjusting operation.

It is a second object of the present invention to provide a static pressure gas bearing assembly wherein the swelling of a porous graphite bearing member used therein is suppressed satisfactorily so that the necessity of strict control of the humidity of the gaseous ambience upon operation of the bearing assembly is avoided.

According to an aspect of the present invention, in order to achieve the first object, there is provided a static pressure gas bearing assembly wherein a pressurized gaseous fluid is discharged from pores of a porous graphite bearing member, having a bearing surface, into a minute clearance between the bearing surface and a member to be supported so as to form in this clearance a gaseous film effective to support the member to be supported and wherein the porous graphite bearing member is provided by an article having been formed by molding, calcining and graphitizing particles of a raw material usable as a carbon material and having particle diameters distributed substantially in a range not greater than 40 microns, the porous graphite bearing member thus having pores distributed substantially uniformly.

In accordance with another aspect of the present invention, to achieve the second object, there is provided a static pressure gas bearing assembly including a porous graphite bearing member whose degree of swelling is not more than 0.02% where the degree of swelling is defined by the following equation:

$$S = \{(Lw - Ld)/Ld\} \times 100$$

wherein S is the degree of swelling, Ld is the size of a test piece which is in a dry state, and Lw is the size of the test piece when it is in a wet state.

With these features of the present invention, the flow rate of the gaseous fluid at the bearing surface becomes uniform with the result that the necessity of the flow adjusting operation which requires expert work of skilled operators, a long working time, many working steps, etc. and which increases the manufacturing cost, can be omitted. Therefore, a high-quality gas bearing assembly can always be manufactured with reduced cost. Further, the porous graphite bearing member used in the present invention shows a very low swelling degree not greater than 0.02%. Accordingly, in operation, it is not necessary to precisely control the ambient humidity.

It is to be noted that the porous graphite bearing member used in the present invention has high hardness. Because of such high hardness, where the bearing assembly of the present invention is used with a rotatable shaft member having a surface coating formed by hard chrome plating or otherwise, there is a possibility of undesirable seizing of the bearing member and the shaft member during rotation thereof if the bearing surface accidentally contacts the shaft member due to any drop of the gaseous fluid supplying pressure, any overloading or otherwise.

In consideration of this, it is a third object of the present invention to provide a combination of a static pressure gas bearing assembly and a member to be supported by the assembly wherein there occurs no seizing between the member and a bearing member during movement of the member, to be supported, relative to the bearing member where a porous graphite material having high hardness is used as the bearing member.

To achieve this object, according to one aspect of the present invention, the surface of the member to be supported by the bearing assembly and opposed to the bearing surface of the bearing member is coated with a film of titanium nitride, particularly suitably by ion plating process.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
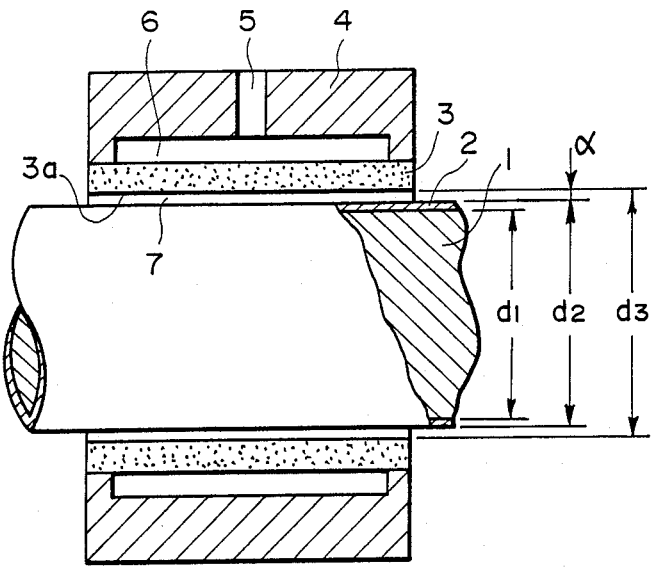
FIG. 1 is a vertical section of a static pressure radial gas bearing assembly according to a first embodiment of the present invention.

Referring first to FIG. 1, there is shown a static pressure radial gas bearing assembly according to one embodiment of the present invention. In this embodiment, the bearing assembly is used to support a member 1 which is a rotational shaft. The shaft 1 has a surface film 2 made of a titanium nitride material (TiN) and formed on the shaft 1 surface by ion plating. The bearing assembly includes a porous bearing member (bearing pad) 3 which is made of porous graphite according to the present invention. The porous graphite member 3 has been made by molding the raw material by cold isostatic press method, calcining the molded article and graphitizing the calcined article. The porous graphite bearing member has formed therein a number of pores which are distributed uniformly. Details of the porous graphite material used in the present embodiment will be described later. The bearing assembly further includes a housing 4, a gaseous fluid supplying port 5 and a gaseous fluid supplying chamber 6.

When, in operation, the pressurized gaseous fluid is supplied from the fluid supplying port 5, the gaseous fluid flows into the fluid supplying chamber 6, and then, flows through the porous member 3, such that the gaseous fluid is discharged from the pores in the bearing surface 3a of the porous bearing member 3. Thus, a gaseous film is formed in a minute clearance between the shaft 1 and the bearing surface 3a. The gaseous fluid forming the gaseous film and thereby supporting the shaft 1 is exhausted outwardly of the bearing assembly.

Table 1 shows the characteristics of the static pressure gas bearing assembly of the present embodiment, as compared with those of a conventional type static pressure gas bearing assembly. In Table 1, the flow rate of the gaseous fluid passed through the porous graphite material (bearing member), the thickness of the porous member and the gaseous fluid supplying pressure have been selected as the characteristics to be compared.

TABLE 1

|  | FLOW RATE (cc/min/cm$^2$) | GRAPHITE THICKNESS (mm) | SUPPLYING PRESSURE (kg/cm$^2$) |
| --- | --- | --- | --- |
| PRIOR ART BEARING PAD WITHOUT FLOW CONTROL | 50–200 | 8.5 | 5 |
| PRIOR ART BEARING PAD WITH FLOW CONTROL | 30–60 | 8.5 | 5 |
| APPLICANTS' BEARING PAD | 20–40 | 5 | 5 |
| DESIGNED VALUE | 30±5 | — | 5 |

It is seen in Table 1 that, in the conventional type gas bearing assembly and in a case where the flow adjustment is not executed to the porous graphite member, the flow rate of the passing gaseous fluid varies extraordinarily in a range from 50 to 200 cc/min/cm$^2$. Also, at the upper limit of the variation, the flow rate of the passing gaseous fluid is too high as compared with the designed value (30±5 cc/min/cm$^2$). When the flow adjustment is executed in the manner described hereinbefore, the flow rate of the passing gaseous fluid comes into a range from 30 to 60 cc/min/cm$^2$ which is near to the designed value. However, for this bearing pad having a bearing surface of an area of approx. 300 cm², a very long time of an order, of about 8 hours is required to complete the flow adjusting operation. As compared therewith, in the gas bearing assembly of the present embodiment, a predetermined flow rate is obtainable without the flow adjustment to the porous graphite member.

Figure 3A:
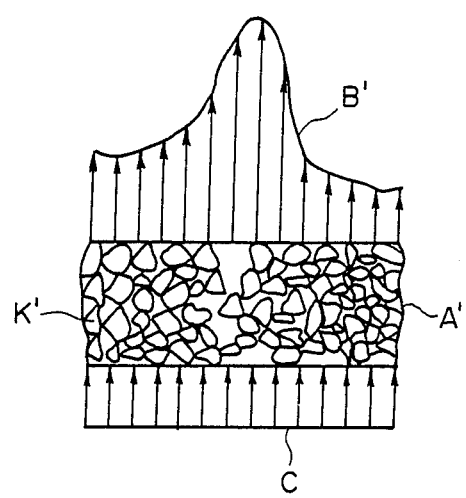
FIG. 3A is a schematic view showing a model of the distribution of the quantity of gaseous fluid passed through a bearing pad of conventional type.
Figure 3B:
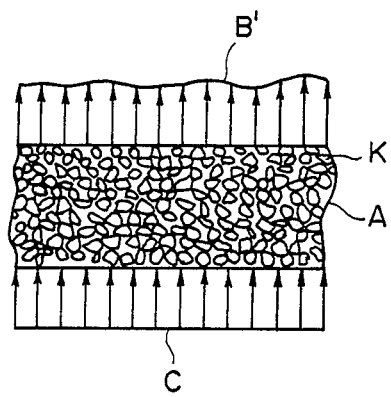
FIG. 3B is a view similar to FIG. 3A but showing a model of the distribution of the quantity of the gaseous fluid passed through a bearing pad used in a bearing assembly according to the present invention.

Referring now to FIGS. 3A and 3B, FIG. 3A is a schematic view showing a model of the distribution of the flow rate (quantity) of gaseous fluid at the bearing surface of a conventional type porous graphite bearing member used in a conventional type static pressure gas bearing assembly. On the other hand, FIG. 3B is a schematic view showing a model of the distribution of the flow rate (quantity) of the gaseous fluid at the bearing surface of the porous graphite bearing member used in the static pressure gas bearing assembly according to the present embodiment. In FIGS. 3A and 3B, a reference character A' denotes the section of the porous graphite used as the conventional type bearing member; a reference character A denotes the section of the porous graphite used in the present embodiment as the bearing member; a reference character B' denotes the distribution of the flow rate of the gaseous fluid passed through the porous graphite member of the conventional bearing assembly; a reference character B denotes the distribution of the flow rate of the gaseous fluid passed through the porous graphite used in the present embodiment; and a reference character C denotes a constant gaseous fluid supplying pressure (g).

From FIGS. 3A and 3B, it is seen that, in the conventional porous graphite material A', the particles K' have non-uniform particle diameters and, in addition thereto, the pores are distributed non-uniformly. Therefore, the distribution B' of the flow rate of the gaseous fluid passed through the bearing pad is not uniform, as illustrated. As compared therewith, in the porous graphite material A of the present embodiment, the particles K have uniformly distributed particle diameters, the diameters being not more than about 40 microns. Particularly, approximately 80% of the particles have diameters ranging from 1-20 microns, as will be described later. Moreover, pores of the graphite material are distributed substantially uniformly. As a result, a substantially uniform distribution of the flow rate of the passing gaseous fluid is obtainable, as illustrated.

As for the porous graphite used in the present embodiment, it can be produced by use of a raw material which is used in the production of such a porous graphite material that is commercially sold in the trade name "Ceraphite" by Toshiba Ceramics Kabushiki Kaisha, Japan). In many cases, such porous graphite material "Ceraphite" is used as a material of a wall member in a high-temperature oven. Also, it is used in a mold.

Next, the porous graphite material used in the present embodiment will be described in detail.

The raw material for the porous graphite member of the present embodiment is obtainable by a known method such as disclosed, for example, in Japanese Published Patent Application, Publication No. 18879/1975. Namely, small spherical particles are first obtained from pitch in a molten state. Then, these particles are made infusible by oxidization. Thereafter, the spherical particles are ground into fine particles by use of an oscillating mill or a ball mill. These fine particles (powder) are usable as the raw material of the porous graphite. Similarly to the aforementioned "Ceraphite", the particle diameters of the obtained fine particles are distributed substantially in a range not greater than approx. 40 microns.

Figure 4:
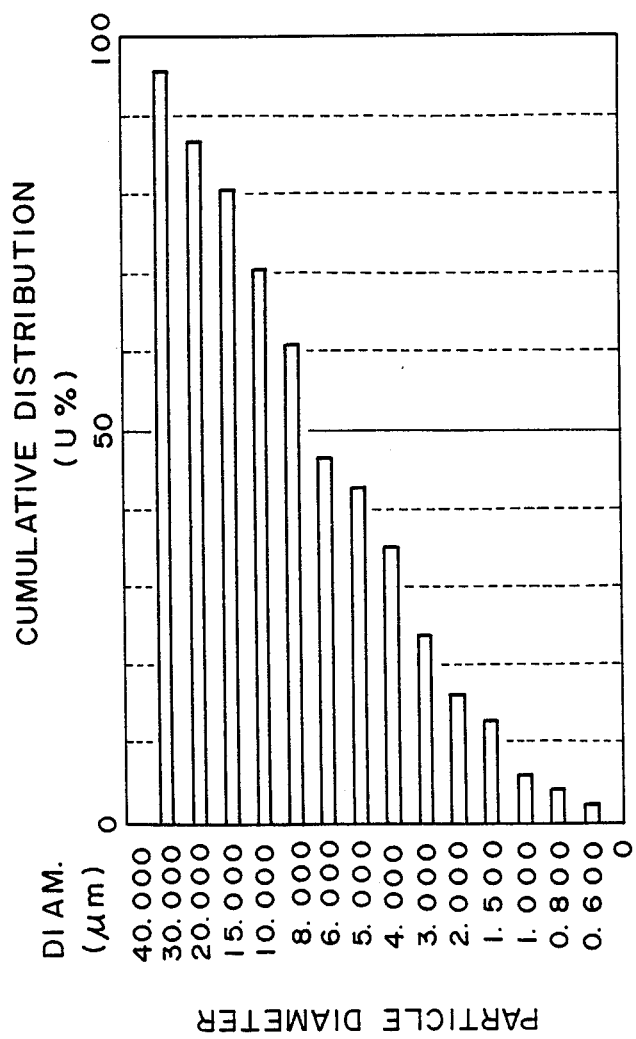
FIG. 4 is a graph showing cumulative particle diameter distribution of the raw material for a porous graphite member used in the present invention.

Typical physical properties of the raw material are listed in Table 2. Also, the diameter distribution is illustrated in FIG. 4. The graph of FIG. 4 shows the cumulative distribution, and each horizontal bar denotes the weight percentage of such particles having diameters not greater than a corresponding diameter value (e.g. 0.6 micron, 0.8 micron, etc.). The average particle diameter of the raw material is 6.5 microns (median average), and approximately 80% of the raw material particles have diameters ranging from 1 to 20 microns.

TABLE 2

| ITEM | | RANGE |
| --- | --- | --- |
| volatile content | (wt. %) | 12–16 |
| benzene insoluble content | (wt. %) | 95–98 |
| nitrobenzene insoluble content | (wt. %) | 50–58 |
| quinoline insoluble content | (wt. %) | 38–46 |
| ash content | (wt. %) | not more than 0.1 |

In the experimental examples, the above described raw material was formed by use of rubber molds and in accordance with CIP (cold isostatic press) method. Actually, while changing the molding pressure in a range from 300 to 1000 kgf/cm², a few molded articles were formed. Each article had a cylindrical shape having an outer diameter of approx. 80 mm, an inner diameter of approx. 65 mm, an axial length of approx. 75 mm and a thickness of approx. 15 mm. Each article was calcined (carbonized) in N₂ ambience for two hours with a temperature of 1100° C. The heating rate was 15° C./h while the temperature dropping rate was 400° C./h. The reason for the relatively slow heating rate (15° C./h) is because the volatile content of the raw material is in a range from 12 to 16%. The heating rate was made slow so as to gradually increase the temperature to thereby remove the volatile content. Rapid temperature increase results in cracks or blisters. After the calcination, each article was subjected to graphitization in Ar gaseous ambience for two hours with a temperature of 2500° C. The heating rate and the dropping rate were 400° C./h. Each of the thus formed graphite members was machined so as to have an outer diameter of 60 mm, an inner diameter of 50 mm, an axial length of 54 mm and a thickness of 5 mm. By the described manner, bearing members were finally obtained. It is to be noted that no binder such as pitch was used for the manufacture of the bearing members.

Figure 5:
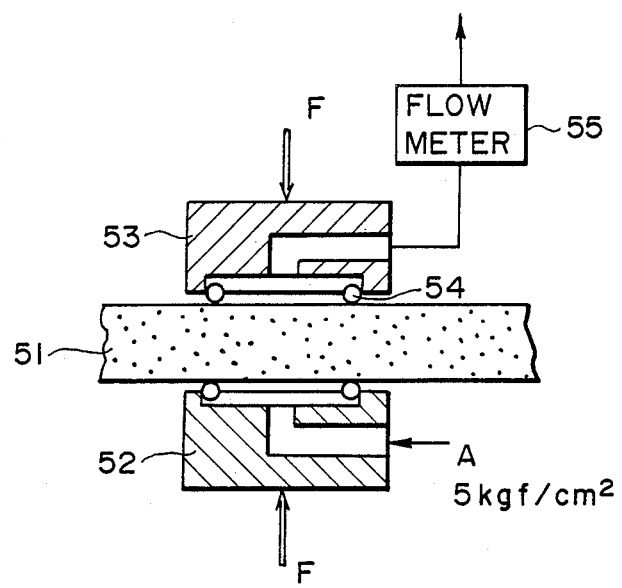
FIG. 5 is a schematic and sectional view illustrating the manner of measurement (metering) of the flow rate of the gaseous fluid passed through a porous member.

The thus formed bearing members were examined and, for each bearing member, the flow rate of the passing gaseous fluid (the quantity of passage of the gaseous fluid) is measured or metered in the manner as illustrated in FIG. 5. In FIG. 5, an examining pad 52 on the gaseous fluid supplying side is pressed in the direction of an arrow F against an outer peripheral surface of a porous member 51. Also, another examining pad 53 which is on the gaseous fluid collecting side is pressed in the direction of an arrow F against an inner peripheral surface of the porous member 51. In the clearances between the pad 52 and the porous member 51 and between the pad 53 and the porous member 51, there are provided O-ring seals 54, made of rubber, in order to prevent leakage of the gaseous fluid from the surface of the porous member 51. On each of the gaseous fluid supplying side and the gaseous fluid collecting side, the area of the portion of the porous member surface as encircled by the O-ring seal 54 is 1 cm². The gaseous fluid such as air is supplied from the gaseous fluid supplying pad 52 in the direction of an arrow A under a pressure of 5 kgf/cm². The gaseous fluid as collected by the collecting pad 53 flows through a flow meter 55, whereby the flow rate is measured or metered. After this, the gaseous fluid is discharged to the atmosphere.

Figure 6:
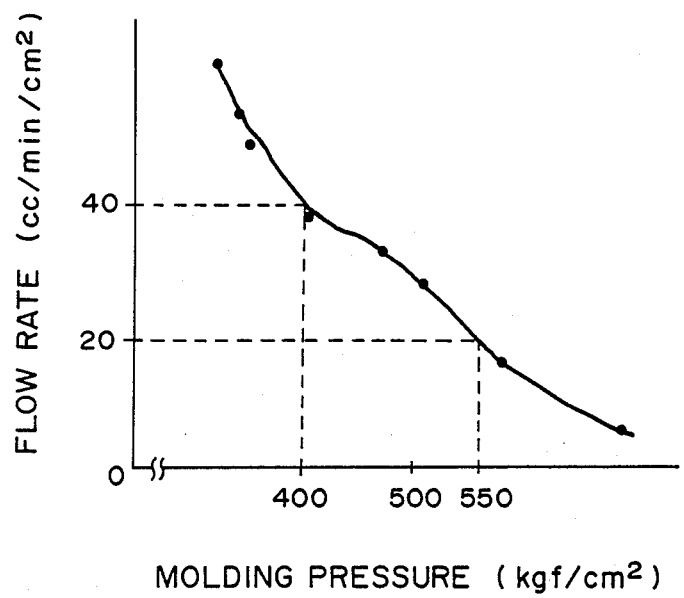
FIG. 6 is a graph showing the relation between the molding pressure and the permeability to gaseous fluid.

FIG. 6 is a graph showing the results of measurement (metering) of the quantity of gaseous fluid passed through various porous graphite members having been produce with different molding pressures, as described hereinbefore. The measurement was made in the manner described with reference to FIG. 5. As illustrated in the graph of FIG. 6, it has been confirmed that a desirable flow rate of the gaseous fluid passing through the porous member (which rate is desirable in a gas bearing assembly) is attainable with a molding pressure within a range of 400–550 Kgf/cm². Further, it has been confirmed that, where the molding pressure is within this range, the variation in the flow rate of the passing gaseous fluid at each portion of the bearing surface is satisfactorily suppressed within a narrow range.

Figure 7:
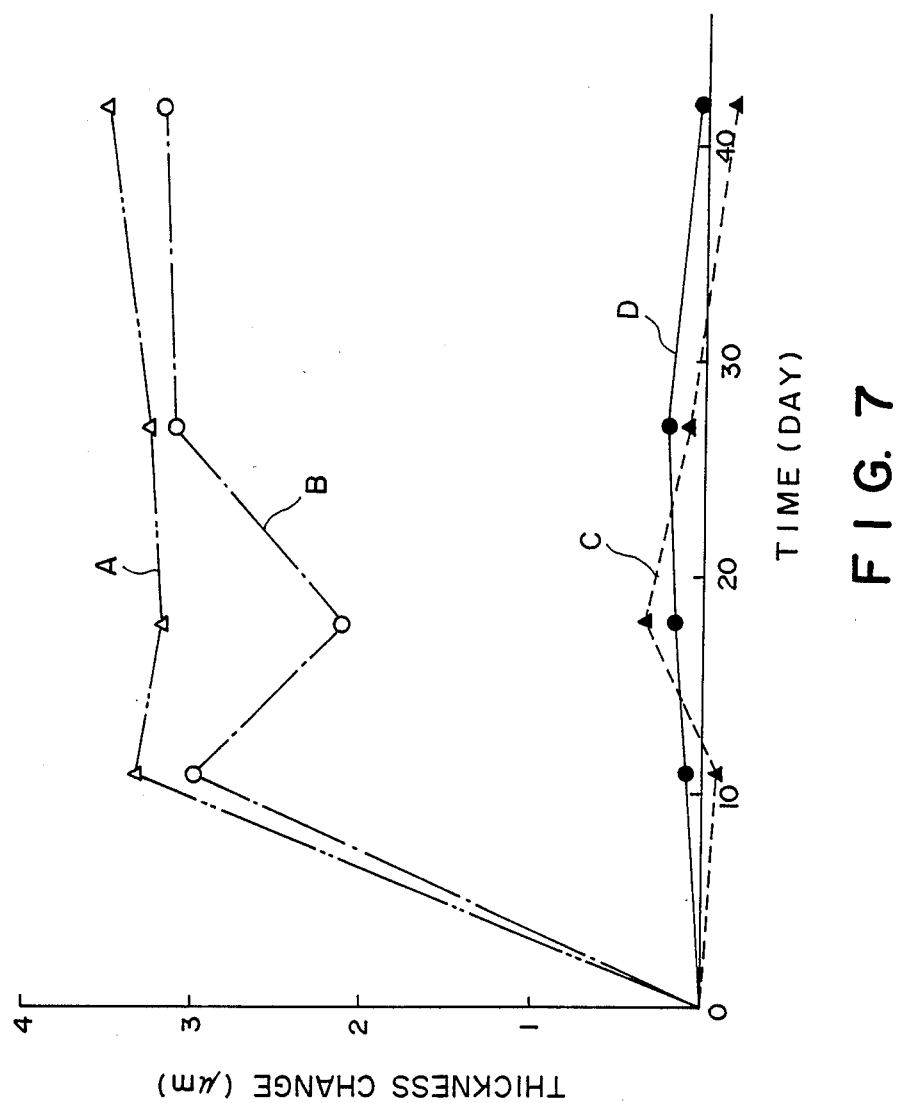
FIG. 7 is a graph showing the change in size with the absorption of moisture or oil by different porous graphite members.

The change in size, due to the moisture absorption, of the porous graphite member of the present embodiment was compared with that of the conventional type porous graphite member. The results of comparison are set forth in Table 3 and are illustrated in the graph of FIG. 7.

TABLE 3

| TEST LIQUID | APPLICANTS' POROUS GRAPHITE | | PRIOR ART POROUS GRAPHITE | |
|---|---|---|---|---|
| | WATER | GRINDING OIL | WATER | GRINDING OIL |
| START | 0 | 0 | 0 | 0 |
| 11TH DAY | +0.11 | −0.08 | +3.00 | +3.33 |
| 18TH DAY | +0.18 | +0.34 | +2.12 | +3.18 |
| 28TH DAY | +0.21 | +0.11 | +3.13 | +3.27 |
| 42ND DAY | +0.04 | −0.18 | +3.19 | +3.53 |
| MAX. | +0.21 | +0.34 | +3.19 | +3.53 |
| ELONGATION RATE (E) AT THE MAX. | 0.004% | 0.007% | 0.06% | 0.07% |

The examination was made by use of test pieces which were formed respectively of different graphite materials produced respectively in accordance with the above-described production conditions. Each test piece was 35 mm in length, 70 mm in width and 5 mm in thickness. The tolerance was zero on the plus (+) side of each numerical value but it was not more than 0.1 mm on the mnus (−) side. The amount of change in the thickness of each test piece was measured by use of a measuring device manufactured by Carl-Zeiss, West Germany, and having a resolution of 0.1 micron. From the measured amount of thickness change, the rate of elongation (E) was calculated. The equation for the calculation and the examination conditions adopted in the examination are as follows:

$$E = \{(L - Lo)/Lo\} \times 100 \ (\%)$$

wherein Lo is the size of a test piece which is in a dry state and L is the size of the test piece which is in a wet state. The value Lo was measured on the condition that, before measurement, the test piece was dried in a drying oven for 24 hours at a temperature of 130° C.; then it was cooled in the oven to a room temperature; then it was taken out of the oven and placed in a sealed glass container and left therein for 4 hours for temperature stabilization (at 23°±0.5° C.). After the temperature stabilization, the size Lo was measured. On the other hand, the value L was measured on the condition that a test piece was dipped in tap water or water-soluble grinding oil diluted with water at the ratio of 1:80 and left therein for 42 days for natural absorption. The dipped test pieces were temporarily picked up out of the solution on each of the 11th day, 18th day, 28th day and the 42nd day and, after 4 hours for temperature stabilization (at 23°±5° C.), the thickness was measured.

From Table 3, it is seen that the test piece made of the conventional porous graphite material and having a thickness of 5 mm showed expansion of an order of 0.07% (3.5 microns). As compared therewith, the test piece made of the porous graphite material of the present embodiment showed expansion of an order of only 0.007% (0.34 micron). Thus, substantially no change in size was noted.

Usually, the porous member usable as a gaseous fluid supplying bearing member in a gas bearing assembly has a thickness in a range of 3–7 mm. This is because of the following reason: Where the clearance between the porous member and the shaft to be supported is constant and if the thickness of the porous member is not greater than 3 mm, the flow rate of the passing gaseous fluid becomes too high with the result that there occurs oscillation. If, on the other hand, the thickness is not less than 7 mm, the flow rate of the passing gaseous fluid becomes too low with the result that the rigidity necessary for the gas bearing assembly is not attainable. In any case, the optimum flow rate of the passing gaseous fluid necessary for assuring the rigidity of the gas bearing assembly is not obtainable.

Burther, usually the clearance between the porous member and the shaft to be supported is within a range of 3–10 microns. This is to assure both the bearing rigidity and the rotating precision. Namely, for a constant thickness (i.e. a constant flow rate of the passing gaseous fluid), a clearance not greater than 3 microns results in degradation of the rotating accuracy while the rigidity is improved. If, on the other hand, the clearance is not less than 10 microns, it is not possible to retain the bearing rigidity. It is to be noted here that the clearance is correlated with the flow rate of the passing gaseous fluid, as follows:

$$Q = (h/ho)^3 Qo$$

where Q is the necessary flow rate for a clearance h and Qo is the necessary flow rate for a clearance ho.

Accordingly, when the flow rate of the passing gaseous fluid is low, the clearance should be made small while, on the other hand, it should be made large in a case where the flow rate of the passing gaseous fluid is high.

From the foregoing, it is seen that in a bearing assembly having a designed bearing clearance of 5±0.5 microns and where a porous member used has a thickness of 5 mm, there would occur a change in size of 3.5 microns (according to the results of experiments described hereinbefore) if the porous member is made of the conventional porous graphite material. If this occurs, then the bearing clearance becomes too narrow with the result that the performance of the bearing assembly such as the bearing rigidity, the rotating precision and otherwise is damaged extraordinarily. Usually, the dimensional tolerance for the bearing clearance which is permissible to obtain proper bearing performance, is of an order of ±0.5 micron where the clearance is 5 microns.

Accordingly, when th elongation of the porous graphite member (used as the bearing member of the gas bearing assembly) in the direction of the thickness thereof is represented by the term "degree of swelling" and where the degree of swelling is defined by the equation:

$$S=\{(Lw-Ld)/Ld\}\times 100$$

wherein S is the degree of swelling, Ld is the size of test piece which is in a dry state and Lw is the size of the test piece when it is in a wet state;
  wherein the size Ld is the size of the test piece after it is dried for 24 hours at a temperature of 130° C. and subsequently cooled to a temperature of 23°±0.5° C. in a sealed container containing silica gel; and
  wherein the size Lw is the size of the test piece after it is dipped in tap water (of a temperature 23°±0.5° C.) for 24 hours for natural absorption;
then, it is seen that the degree of swelling of the porous graphite material usable as the bearing member of the gas bearing assembly should be not greater than 0.02%. The porous graphite material of the present embodiment sufficiently satisfies this condition. As compared therewith, the degree of swelling of the conventional porous graphite material is about 0.06–0.07%.

As for the raw material of the porous graphite of the present embodiment, meso-carbon microbeads (hereinafter "MC microbeads") are also usable. The MC microbeads can be produced by a known method such as disclosed, for example, in Japanese Published Patent Application, Publication No. 39633/1975. Now, description will be made of an embodiment of a bearing assembly which uses the MC microbeads as the raw material.

Figure 8:
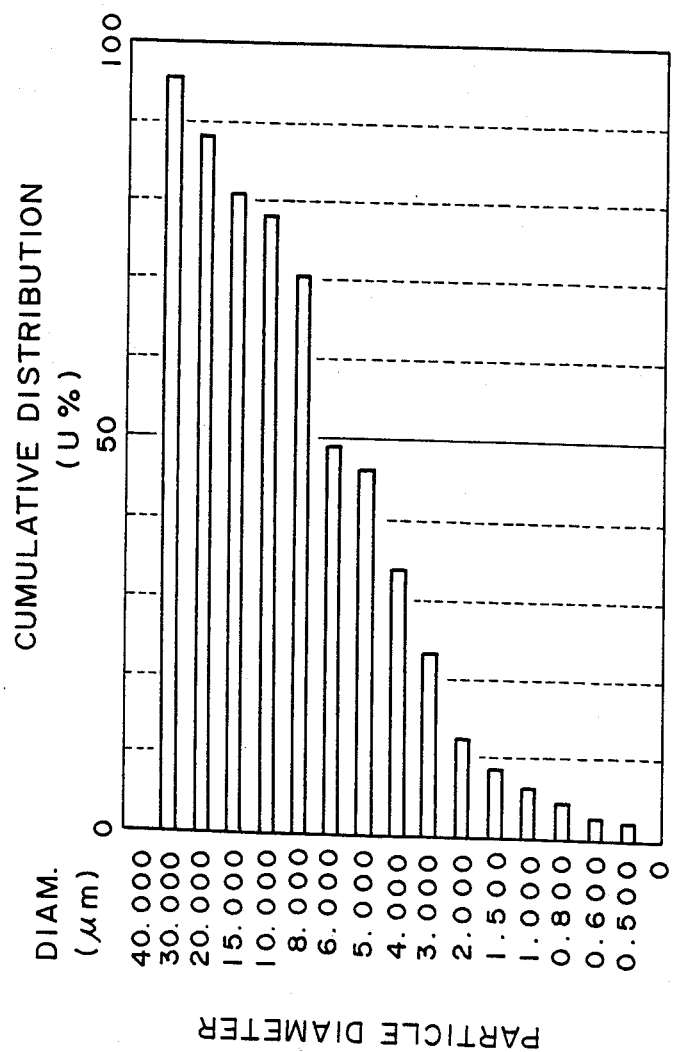
FIG. 8 is a view similar to FIG. 4 but showing cumulative particle diameter distribution of meso-carbon microbeads usable as the raw material of the porous graphite member of the bearing assembly according to the present invention.

Table 4 shows typical physical properties of the MC microbeads. Also, FIG. 8 is a graph similar to the graph of FIG. 4 but showing the cumulative distribution of the particle diameter of the MC microbeads.

TABLE 4

| ITEM | | RANGE |
|---|---|---|
| volatile content | (wt. %) | 8–15 |
| toluene insoluble content | (wt. %) | 92–99 |
| quinoline insoluble content | (wt. %) | 78–95 |
| ash content | (wt. %) | not more than 0.3 |
| true specific gravity | (wt. %) | 1.40–1.48 |
| particle diameter (Example) | (micron) | Ave.: 0.6, Diam. of major part (85%) ranges 1–20 microns |

It is expected that, when the MC microbeads are used, more uniform distribution of the flow rate of the passing gaseous fluid is obtainable because each particle has a shape of nearly a true sphere. Further, the time necessary for the manufacture can be reduced because the heating rate in the heating oven for the carbonization can be made higher.

In the present embodiment, the MC microbeads were used as the raw material and the porous graphite was produced in the following manner:

First, the MC microbeads were introduced into rubber molds in accordance with the cold isostatic press molding method. Then, by use of different molding pressures ranging from 350–750 Kgf/cm$^2$, a few articles were formed. Thereafter, these articles were calcined (carbonized) by placing them in an ambience of N$_2$ for two hours at a temperature of 1100° C. with the heating rate of 100° C./h and with a temperature dropping rate of 400° C./h.

Subsequently, the calcined articles were graphitized by placing them in an ambience of Ar gas for two hours at a temperature of 2500° C. with both the heating rate and the temperature dropping rate being maintained at 400° C./h. The thus formed carbon members were machined, and final bearing members were obtained. As for the dimension, these porous bearing members are the same as those of the foregoing example. The thus formed bearing members were examined, and the measurement (metering) of the flow rate therethrough and the measurement of the swelling were carried out in the same manner as in the foregoing example. From the results of examination, it has been confirmed that, with the molding pressure within a range of 400–600 Kgf/cm$^2$, satisfactory performance of the gas bearing assembly is attainable and, in addition thereto, the degree of swelling can be retained at a very low value not greater than 0.02%.

Referring back to FIG. 1, the film coating 2 of titanium nitride (TiN) material formed on the shaft 1 surface by the ion plating is effective to prevent seizing of the bearing member with the shaft. Namely, the porous graphite of the present embodiment has hardness (bearing surface hardness: Hv 1000) which is significantly higher than that of the conventional porous graphite (having the bearing surface hardness: Hv 600). Therefore, in a case where a shaft member having a surface coating formed by the hard chrome plating (providing surface hardness of Hv 800) or otherwise is used as the shaft 1, there is a possibility of undesirable seizing of the bearing member and the opposed shaft member during rotation thereof if the bearing surface 3a accidentally contacts the shaft member 1 due to any drop of the gaseous fluid supplying pressure, any overloading or otherwise. Such undesirable seizing can be substantially completely avoided according to the present embodiment. Namely, the surface film of the titanium nitride material formed on the shaft 1 surface by the ion plating has a high hardness (surface hardness of Hv 1800). Also, the titanium nitride material has self-lubricating properties. Thus, the provision of the titanium nitride surface coating is effective to prevent the seizing. It has been confirmed by experiments that the advantageous effect of the provision of the titanium nitride coating is retained even in a case where the porous graphite material of the present embodiment having high surface hardness is used.

In the FIG. 1 embodiment, a shaft receiving bore 7 of the bearing assembly and the surface of the shaft 1 may be machined in the following manner: First, the shaft receiving bore 7 is finished by machining with a predetermined geometrical precision such as the roundness, cylindricity and otherwise, with the inner diameter being denoted by d3. Subsequently, while taking the optimum bearing clearance as being α, the shaft 1 is finished by machining with predetermined geometrical precision so that its outer diameter d1 becomes slightly smaller than "d3−2α". After the machining, the shaft 1 is coated with titanium nitride by the ion plating, until the outer diameter d2 including the thickness of the surface coating 2 becomes equal to "d3−2α". At this time, the film 2 can be formed on the shaft 1 surface with uniform thickness by th ion plating technique. Further, by suitably setting the conditions of the ion plating treatment, the thickness of the film 2 can be determined easily. For this reason, at the time of machining (cutting, grinding, etc.) of the shaft 1, it is only necessary for the machining operation to finish the shaft 1 surface so as to assure the geometrical precision (roundness, cylindricity, etc.) of an order of submicrons. The exact outer diameter d2 which is finally required in the shaft 1 can be achieved by the formation of the surface coating 2 by the ion plating treatment.

The provision of the titanium nitride coating on the shaft 1 surface provides various advantageous effects such as follows.

(1) Even if the surface of the bearing member made of porous graphite having high hardness contacts the surface of the shaft during rotation thereof, undesirable seizing can be prevented.

(2) Conducting, at separate stages, the finishing of the geometrical precision by the machining (cutting, grinding, etc.) and the finishing of dimensional precision by the ion plating treatment, allows facilitated machining of the shaft and the shaft receiving bore as compared with the conventional technique wherein the geometrical precision and the dimensional precision have to be determined at the same time only by the cutting, grinding, etc. As a result, with the present invention, the yield of articles can be improved.

Figure 2:
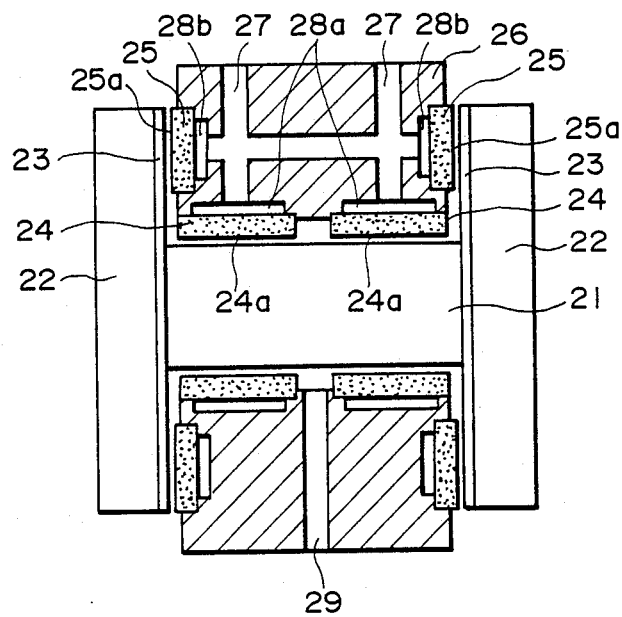
FIG. 2 is a vertical section of a static pressure thrust and radial gas bearing assembly according to a second embodiment of the present invention.

Referring now to FIG. 2, there is shown a second embodiment of the present invention. In this embodiment, the invention is applied to a static pressure thrust and radial gas bearing assembly, and in FIG. 2 the assembly is illustrated in a vertical section. Denoted at 21 is a rotational shaft having a titanium nitride coating formed on the surface thereof by the ion plating treatment in a similar manner as the case of the shaft 1 of the FIG. 1 embodiment. Denoted at 22 are thrust plates provided at the opposite ends of the shaft 21. Each thrust plate 22 has a titanium nitride coating provided, by the ion plating treatment, on the surface thereof as opposed to a corresponding thrust bearing surface 25a of the bearing assembly.

The static pressure gas bearing assembly of the present embodiment further includes radial bearing members 24 each made of a porous material and having a cylindrical shape; thrust bearing members 25 each made of a porous material and having a ring-like shape; a housing 26; gaseous fluid supplying ports 27; gaseous fluid supplying chambers 28a and 28b; and a fluid exhausting port 29.

In operation, the pressurized gaseous fluid supplied from the supplying ports 27 flows into the fluid supplying chambers 28a and, then, from these chambers the fluid flows into the radial and porous bearing members 24 and is discharged from their bearing surfaces 24a into a minute clearance between the shaft 21 and the bearing surfaces 24a. Thus, a gaseous film is formed in this clearance. The gaseous fluid thus forming the gaseous film and supporting the shaft 21 in the radial direction is exhausted from the port 29. On the other hand, the pressurized gaseous fluid supplied from the supplying chambers 28b and passed through the thrust and porous bearing members 25 is discharged from the bearing surfaces 25a into minute clearances defined between the bearing surfaces 25a and the thrust plates 22. Thus, in each clearance, a gaseous film is formed to support the shaft 21 by way of the thrust plates 22, in the thrust direction. The gaseous fluid forming the gaseous film is exhausted while supporting the shaft 21 in the described manner. Each of the radial bearing members 24 and the thrust bearing members 2 is made of porous graphite having been produced by molding (by cold isostatic pressing), calcination and graphitization, with its pores being distributed uniformly.

In each of the foregoing embodiments, the porous graphite material of the present invention preferably has a void content in a range of 17–20% with a further effect of preventing both the self-excited vibration and the decrease in the flow rate.

While the invention has been described with reference to the structures disclosed herein, it is not confined to the details set forth and this application is intended to cover such modifications or changes as may come within the purposes of the improvements or the scope of the following claims.

What is claimed is:

1. A static pressure gas bearing assembly, comprising:
   a porous graphite member disposed to provide a bearing surface and made by molding, calcining and graphitizing carbon particles, having particle diameters distributed in a range not more than approximately 40 microns, such that a number of pores are substantially uniformly distributed in said porous graphite member; and
   means for supplying a gaseous fluid to said porous graphite member so that the gaseous fluid is discharged through said pores and form said bearing surface of said porous graphite member.

2. A static pressure gas bearing assembly, comprising:
   a porous graphite member disposed to provide a bearing surface and made by molding, calcining and graphitizing carbon particles having particle diameters not more than approximately 40 microns, with approximately 80% of the carbon particles having particle diameters ranging from 1 to 20 microns, such that a number of pores are substantially uniformly distributed in said porous graphite member; and
   means for supplying a gaseous fluid to said porous graphite member so that the gaseous fluid is discharged through said pores and from said bearing surface of said porous graphite member.

3. A static pressure gas bearing assembly, comprising:
   a porous graphite member disposed to provide a bearing surface; and
   means for supplying a gaseous fluid to said porous graphite member so that the gaseous fluid is discharged from said bearing surface of said porous graphite member;
   wherein said porous graphite member has a degree of swelling of not more than 0.02% when the degree of swelling is defined by the following equation:

$$S = \{(Lw - Ld)/Ld\} \times 100$$

where S is the degree of swelling, Ld is the size of a test piece which is in a dry state, and Lw is the size of the test piece when it is a wet state.

4. A combination, comprising:
   a static pressure gas bearing assembly; and
   a member to be supported by said bearing assembly, wherein said bearing assembly includes a porous graphite member disposed to provide a bearing surface, and means for supplying a gaseous fluid to said porous graphite member so that the gaseous fluid is discharged from said bearing surface, wherein said member to be supported has a titanium nitride film formed on the surface thereof to be opposed to said bearing surface of said porous graphite member, and wherein said porous graphite member is made by molding, calcining and graphitizing carbon particles, having particle diameters distributed in a range not more than approximately 40 microns, such that a number of pores are substantially uniformly distributed in said porous graphite member.

5. A combination according to claim 4, wherein said titanium nitride film is formed on said member to be supported, by ion plating.

6. A combination, comprising:

a static pressure gas bearing assembly; and a member to be supported by said bearing assembly, wherein said bearing assembly includes a porous graphite member disposed to provide a bearing surface, and means for supplying a gaseous fluid to said porous graphite member so that the gaseous fluid is discharged from said bearing surface, wherein said member to be supported has a titanium nitride film formed on the surface thereof to be opposed to said bearing surface of said porous graphite member, and wherein said porous graphite member is made by molding, calcining and graphitizing carbon particles having particle diameters not more than approximately 40 microns, with approximately 80% of the carbon particles having particle diameters ranging from 1 to 20 microns, such that a number of pores are substantially uniformly distributed in said porous graphite member.

7. A combination according to claim 6, wherein said titanium nitride film is formed on said member to be supported, by ion plating.

8. A combination, comprising:

a static pressure gas bearing assembly; and a member to be supported by said bearing assembly;

wherein said bearing assembly includes a porous graphite member disposed to provide a bearing surface, and means for supplying a gaseous fluid to said porous graphite member so that the gaseous fluid is discharged from said bearing surface, wherein said member to be supported has a titanium nitride film formed on the surface thereof to be opposed to said bearing surface of said porous graphite member, and wherein said porous graphite member has a degree of swelling of not more than 0.02% when the degree of swelling is defined by the following equation:

$$S = \{(Lw - Ld)/Ld\} \times 100$$

where S is the degree of swelling, Ld is the size of a test piece which is in a dry state, and Lw is the size of the test piece when it is in a wet state.

9. A combination according to claim 8, wherein said titanium nitride film is formed on said member to be supported, by ion plating.

* * * * *

UNITED STATES PATENT AND TRADEMARK OFFICE
CERTIFICATE OF CORRECTION

PATENT NO. : 4,838,710
DATED : June 13, 1989
INVENTOR(S) : Ohta, et al.

It is certified that error appears in the above-identified patent and that said Letters Patent is hereby corrected as shown below:

COLUMN 5:

Line 3, "order," should read --order--.

COLUMN 7:

Line 12, "produce" should read --produced--.

COLUMN 8:

Line 37, "Burther," should read --Further,--.

COLUMN 9:

Line 7, "th" should read --the--.

COLUMN 11:

Line 4, "th" should read --the--.

UNITED STATES PATENT AND TRADEMARK OFFICE
CERTIFICATE OF CORRECTION

PATENT NO. : 4,838,710

DATED : June 13, 1989

INVENTOR(S) : Ohta, et al.

It is certified that error appears in the above-identified patent and that said Letters Patent is hereby corrected as shown below:

COLUMN 12:

Line 6, "members 2" should read --members 25--.

Line 32, "form" should read --from--.

Line 63, "is" should read --is in--.

Signed and Sealed this

Fourteenth Day of August, 1990

Attest:

HARRY F. MANBECK, JR.

*Attesting Officer*    *Commissioner of Patents and Trademarks*